United States Patent
Mimura et al.

(10) Patent No.: US 7,847,281 B2
(45) Date of Patent: Dec. 7, 2010

(54) SEMICONDUCTOR DEVICE WITH STRAIN IN CHANNEL REGION AND ITS MANUFACTURE METHOD

(75) Inventors: Takashi Mimura, Kawasaki (JP); Atsushi Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 101 days.

(21) Appl. No.: 12/057,427

(22) Filed: Mar. 28, 2008

(65) Prior Publication Data
US 2008/0303062 A1 Dec. 11, 2008

Related U.S. Application Data

(63) Continuation of application No. PCT/JP2005/017839, filed on Sep. 28, 2005.

(51) Int. Cl.
H01L 29/06 (2006.01)
H01L 31/072 (2006.01)
H01L 31/0336 (2006.01)
H01L 31/0328 (2006.01)
H01L 31/109 (2006.01)

(52) U.S. Cl. .................. 257/18; 257/19; 257/20; 257/E29.193

(58) Field of Classification Search .............. None
See application file for complete search history.

(56) References Cited

U.S. PATENT DOCUMENTS 6,960,781 B2 * 11/2005 Currie et al. .............. 257/19
7,227,205 B2 * 6/2007 Bryant et al. .............. 257/288
7,494,906 B2 * 2/2009 Kammler et al. .......... 438/528
2003/0040158 A1 * 2/2003 Saitoh ....................... 438/279
2004/0029323 A1 2/2004 Shimizu et al.
2005/0093021 A1 5/2005 Ouyang et al.

FOREIGN PATENT DOCUMENTS

JP 2005-217391 A 8/2005
WO 02/43151 A1 5/2002

OTHER PUBLICATIONS

Search Report dated Nov. 1, 2005 issued in corresponding International Application No. PCT/JP2005/017839.
Translation of the Written Opinion of the International Searching Authority issued in corresponding International Application No. PCT/JP2005/017839.
I. Aberg et al., "High Electron and Hole Mobility Enhancements in Thin-Body Strained Si/Strained SiGe/Strained Si Heterostructures in Insulator" IEDM Technical Digest, pp. 173-176, Dec. 2004.

* cited by examiner

Primary Examiner—Zandra Smith
Assistant Examiner—Khanh B Duong
(74) Attorney, Agent, or Firm—Fujitsu Patent Center

(57) ABSTRACT

A first film made of SiGe is formed over a support substrate whose surface layer is made of Si. A gate electrode is formed over a partial area of the first film, and source and drain regions are formed in the surface layer of the support substrate on both sides of the gate electrode. The gate electrode and source and drain regions constitute a first field effect transistor. A first stressor internally containing compressive strain or tensile strain is formed over the first film on both sides of the gate electrode of the first field effect transistor. The first stressor forms strain in a channel region.

18 Claims, 14 Drawing Sheets

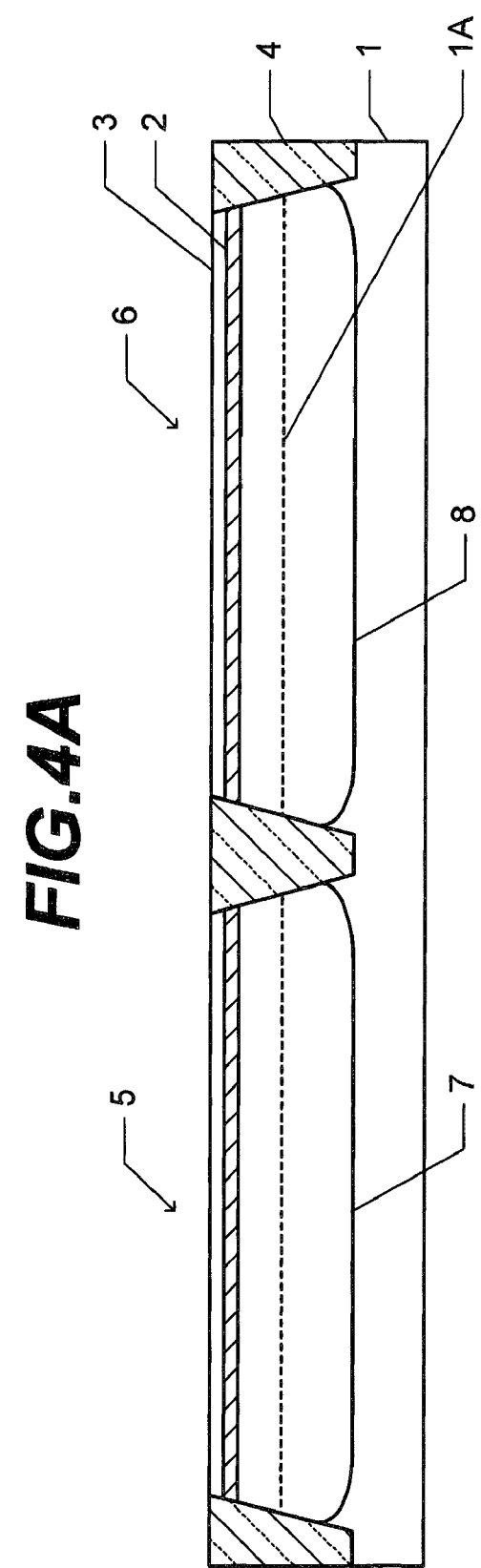

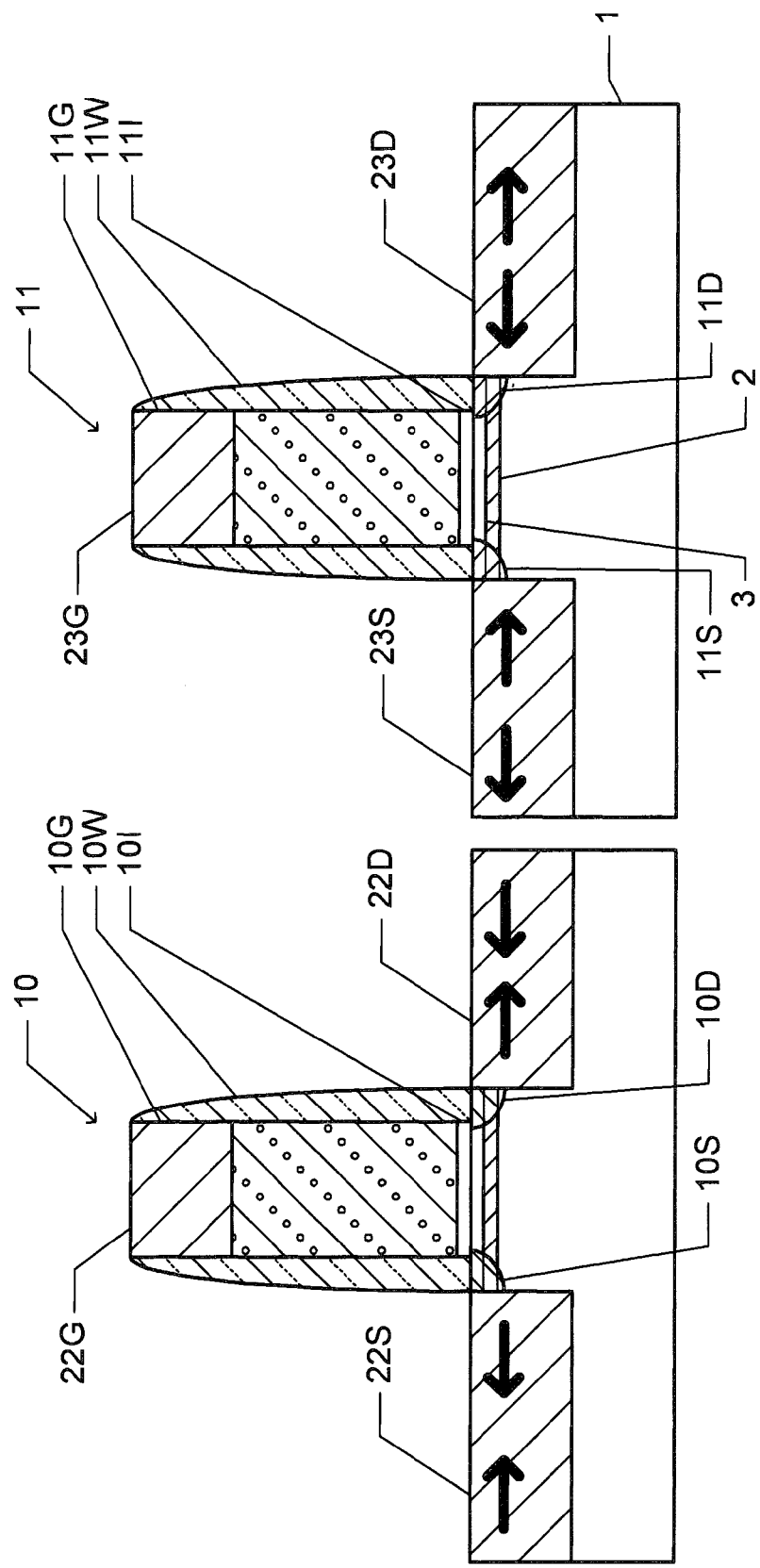

SEMICONDUCTOR DEVICE WITH STRAIN IN CHANNEL REGION AND ITS MANUFACTURE METHOD

CROSS REFERENCE TO RELATED APPLICATION

This application is based on PCT/JP2005/017839, filed on Sep. 28, 2005, the entire contents of which are incorporated herein by reference.

TECHNICAL FIELD

The present invention relates to a semiconductor device and its manufacture method.

BACKGROUND

In order to improve a carrier mobility of a field effect transistor (FET) having a hetero junction of Si and SiGe in the channel region, there is known the technique that an n-channel FET uses as a channel an Si layer having tensile strain, and a p-channel FET uses as a channel an SiGe layer having compressive strain. In order to form a CMOS circuit, it is necessary to form a Si layer having tensile strain and a SiGe layer having compressive strain on the same substrate.

With reference to FIGS. 1A to 1C, description will be made on a method of forming a Si layer having tensile strain and a SiGe layer having compressive strain on the same substrate (I. Aberg et al., IEDM Technical Digest, pp. 173 to 176, Dec. (2004)).

As shown in FIG. 1A, on a single crystal Si substrate 100 manufactured by the Czochralski method, a relaxation buffer layer 101 made of SiGe is grown at a growth temperature of 900° C. The relaxation buffer layer 101 has a higher Ge concentration with distance from the substrate 100, and a lattice constant at the upper surface of the relaxation buffer layer 101 is larger than that of Si.

Two etching stopper layers 102 and 104 made of SiGe and two strain Si layers 103 and 105 made of Si are alternately grown on the relaxation buffer layer 101 at a growth temperature of 680° C. The strain Si layers 103 and 105 have tensile strain because of lattice mismatch with the lattice constant at the upper surface of the relaxation buffer layer 101.

A strain SiGe layer 106 is grown on the strain Si layer 105 at a growth temperature of 525° C., and a strain Si layer 107 is grown on the strain SiGe layer 106. The strain SiGe layer 106 has compressive strain because of lattice mismatch generated by a lamination of the relaxation buffer layer 101 and strain Si layers 103 and 105. The strain Si layer 107 has tensile strain.

On the strain Si layer 107, a silicon oxide layer 108 is formed by low pressure chemical vapor deposition (LPCVD). Thereafter, annealing is performed at temperatures 650° and 750° to densify semiconductor material constituting each layer. After annealing, the surface of the silicon oxide layer 108 is polished to planarize the surface.

As shown in FIG. 1B, the silicon oxide layer 108 faces a handle wafer 110 to adhere to the handle wafer 110. As shown in FIG. 1C, layers from the Si substrate 100 to etching stopper layer 104 are removed by mechanical polishing or wet etching. In this manner, a hetero junction structure can be formed which has three layers of the strain Si layer 107, strain SiGe layer 106 and strain Si layer 105.

With the conventional method illustrated in FIGS. 1A to 1C, a lattice constant on the upper surface of the relaxation buffer layer 101 is less likely to be uniform in-plane, and is likely to be irregular. The lattice constant is changed in a thickness direction by intentionally generating transition in the relaxation buffer layer 101. Therefore, the crystal quality of each layer formed on and over the relaxation buffer layer is degraded. When this layer is used as a channel or the like of FET, reduction of a threshold voltage, increase of a leak current, etc occur. Manufacture processes are complicated, and special apparatus and chemicals are required which are not used by general semiconductor processes.

SUMMARY

According to one aspect of an embodiment, there is provided a semiconductor device having a support substrate whose surface layer is made of Si; a first film made of SiGe and formed on the support substrate; a first field effect transistor including a gate electrode formed in a partial area of the first film and source and drain regions formed in the surface layer of the support substrate on both sides of the gate electrode; and a first stressor containing compressive strain or tensile strain and formed on the first film on both sides of the gate electrode of the first field effect transistor.

According to another aspect of an embodiment, there is provided a semiconductor device manufacture method having: (a) forming a first film made of SiGe having compressive strain on a support substrate at least whose surface layer is made of Si; (b) forming a gate electrode in a partial area of the first film; (c) doping impurities into the first film and the surface layer of the support substrate on both sides of the gate electrode; and (d) covering the gate electrode and a substrate surface adjacent to the gate electrode with a stressor containing compressive strain or tensile strain.

BRIEF DESCRIPTION OF THE DRAWINGS

FIGS. 4A to 4D are cross sectional views of the semiconductor device during manufacture according to the first embodiment;

FIGS. 5A to 5D are cross sectional views of the semiconductor device during manufacture according to the second embodiment;

DESCRIPTION OF THE EMBODIMENTS

Figure 1A:
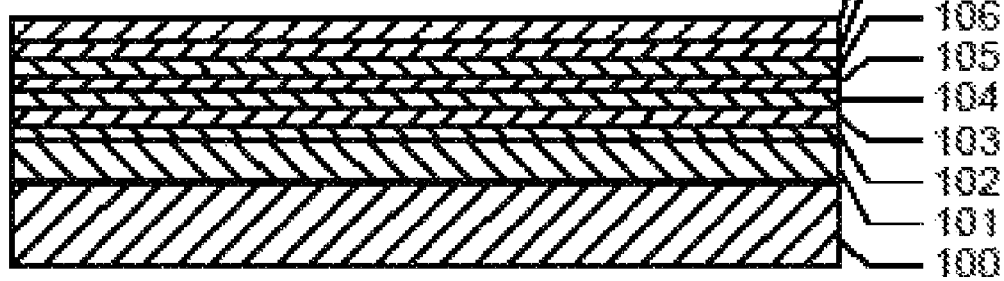
FIGS. 1A to 1C are cross sectional views of a substrate illustrating a conventional method of forming a strain Si layer and a strain SiGe layer.
Figure 1B:
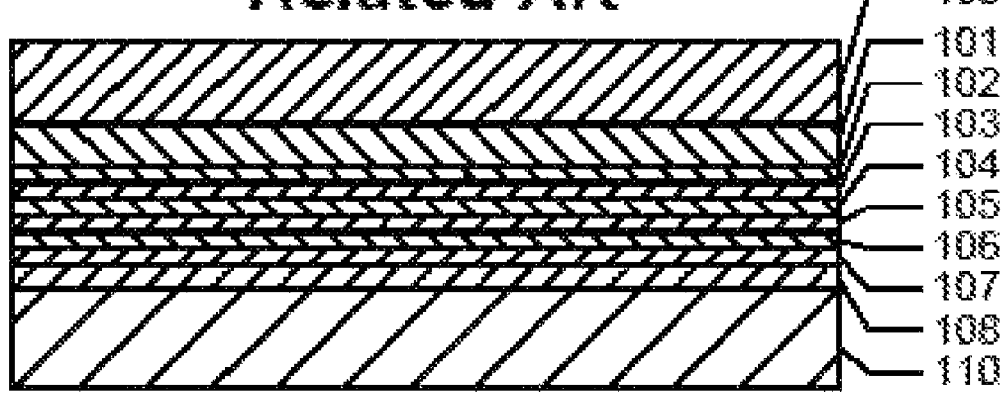
Figure 1C:
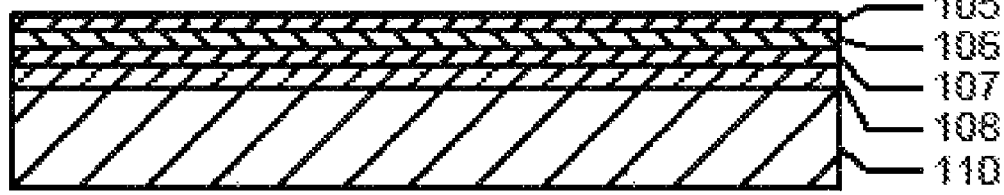
Figure 2:
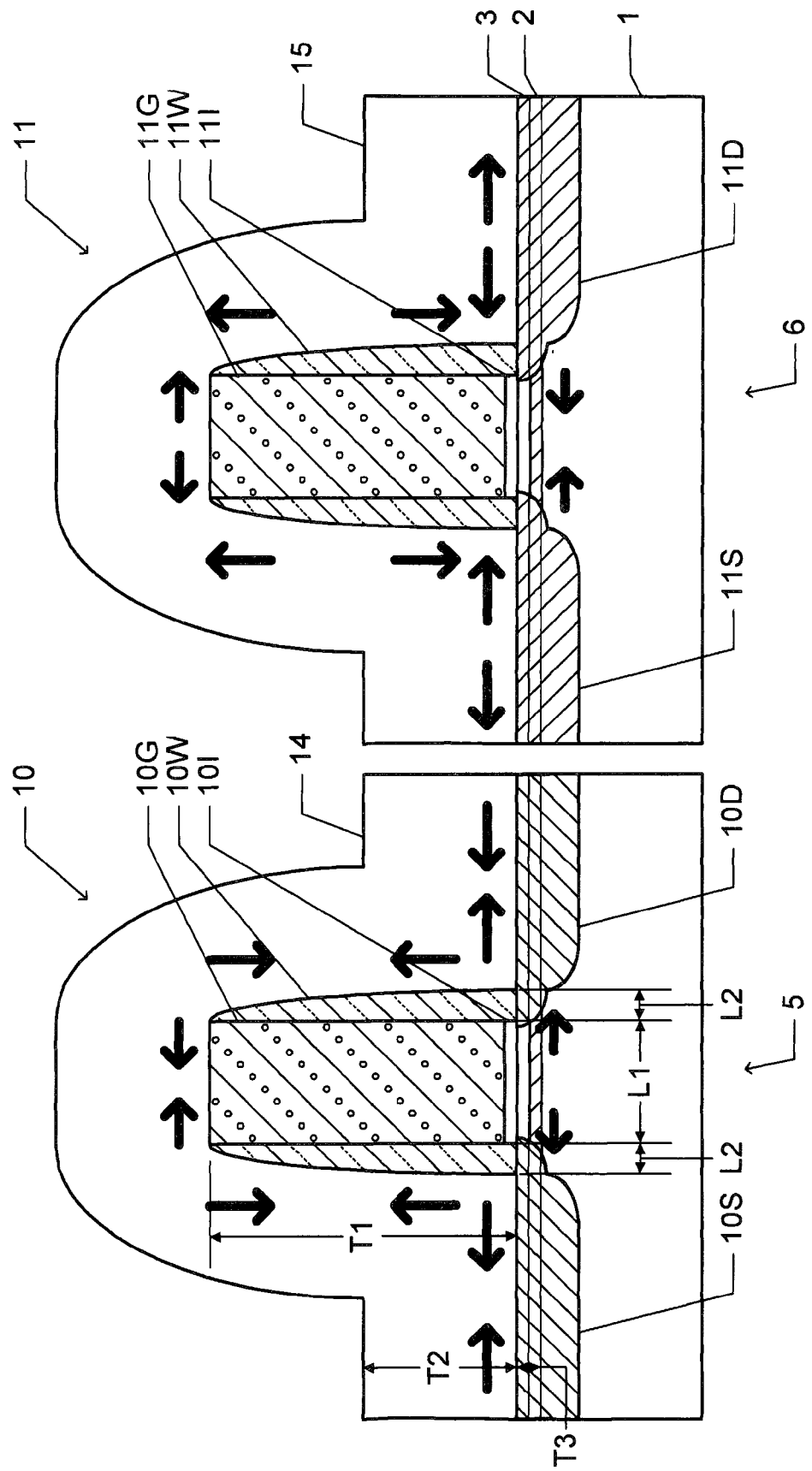
FIG. 2 is a cross sectional view of a semiconductor device according to a first embodiment.

FIG. 2 is a cross sectional view of a semiconductor device of the first embodiment. A left half of FIG. 2 shows an n-channel MOSFET 10, and a right half shows a p-channel MOSFET 11. The n-channel MOSFET 10 and p-type MOSFET 11 are formed in active regions 5 and 6, respectively, defined by an isolation insulating film.

On a support substrate 1 made of Si, a first film 2 made of SiGe and a second film 3 made of Si are laminated in this order. A composition ratio of Si to Ge of the first film is, e.g., 8:2. Since a lattice constant of SiGe is different from that of Si, strain is generated in the first film 2. A thickness of the first film 2 is equal to or thinner than a critical thickness, which means a maximum thickness to which crystal can grow without relaxation of strain. For example, the first film 2 has a thickness of 10 nm. The critical thickness depends on the SiGe composition. A thickness of the second film 3 is, e.g., 5 nm.

A gate insulating film 101 made of silicon oxide is formed in a partial surface area of the second film 3 in the active region 5, and a gate electrode 10G made of polysilicon is formed on the gate insulating film. Side wall spacers 10W made of silicon oxide are formed on side walls of the gate electrode 10G. A source region 10S and a drain region 10D of a lightly doped drain (LDD) structure doped with n-type dopant are formed in a substrate surface layer on both sides of the gate electrode 10G. The n-channel MOSFET 10 is constituted of the gate insulating film 101, gate electrode 10G, side wall spacers 10W, source region 10S and drain region 10D.

The p-channel MOSFET 11 is formed in another active region 6. The p-channel MOSFET 11 is constituted of a gate insulating film 11I, a gate electrode 11G, side wall spacers 11W, a source region 11S doped with p-type dopant and a drain region 11D doped with p-type dopant.

A first stressor 14 made of silicon nitride (SiN) is formed on the surface of the second film 3 on both sides of the gate electrode 10G of the n-channel MOSFET 10, and a second stressor 15 made of SiN is formed on the surface of the second film 3 on both sides of the gate electrode 11G of the p-channel MOSFET 11. The first stressor 14 also covers the side walls and upper surface of the gate electrode 10G, and the second stressor 15 also covers the side walls and upper surface of the gate electrode 11G. The first stressor 14 internally contains tensile stress, and the second stressor 15 internally contains compressive stress.

The size of constituent elements of the n-channel MOSFET 10 will be described. The sizes of constituent elements of the p-channel MOSFET 11 are almost the same as that of the n-channel MOSFET 10.

A gate length L1 (a size of the gate electrode 10G in a carrier transferring direction) is about 45 nm, and a thickness L2 of the side wall spacer 10W is about 10 nm. A height T1 is 100 to 150 nm from the upper surface of the second film 3 to the upper surface of the gate electrode 10G, i.e., from the bottom of the first stressor 14 disposed on both sides of the gate electrode 10G to the bottom of the first stressor 14 disposed on the upper surface of the gate electrode 10G. A thickness T2 of the first stressor 14 on both sides of the gate electrode 10G is 50 to 80 nm. A depth T3 is about 15 nm from the bottom of the first stressor 14 to the bottom of the first film 2.

Since the first stressor 14 internally contains tensile stress, the first stressor 14 tends to shrink in an in-plane direction on both sides of the gate electrode 10G. Therefore, tensile stress in a gate length direction (carrier transferring direction) is applied to the channel region just under the gate electrode 10G. Tensile strain in the gate length direction is therefore generated in the surface layers of the second film 3 and support substrate 1 in the channel region. In the first film 2 in which compressive strain was generated just after film formation, a degree of compressive strain is relaxed.

Since the second stressor 15 internally contains compressive stress, the second stressor 15 tends to expand in the in-plane direction on both sides of the gate electrode 11G. Therefore, compressive stress in the in-plane direction is applied to the channel region just under the gate electrode 11G. Compressive strain in the gate length direction is therefore generated in the surface layers of the second film 3 and support substrate 1 in the channel region. In the first film 2 in which compressive strain was generated just after film formation, a degree of compressive strain increases.

Figure 3A:
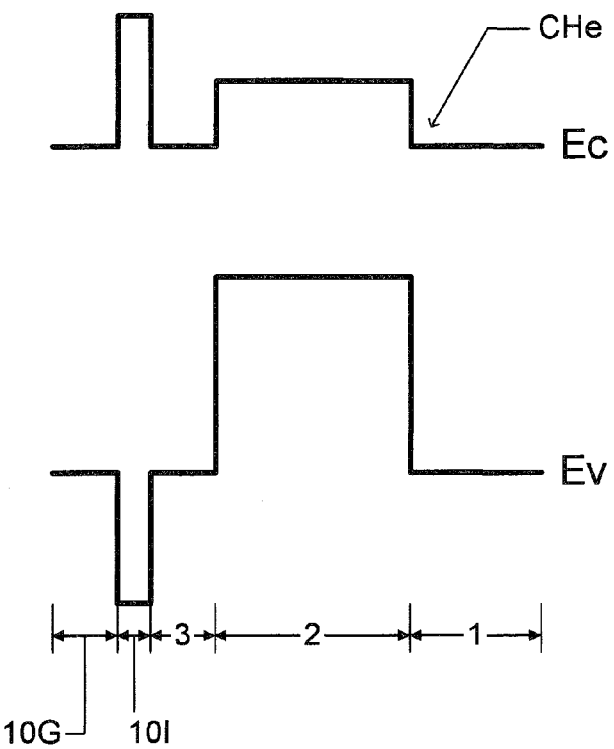
FIGS. 3A and 3B are energy band diagrams in a depth direction of an n-channel MOSFET and a p-channel MOSFET, respectively, of the semiconductor device of the first embodiment.

FIG. 3A is an energy band diagram of the channel region of the n-channel MOSFET 10. A lateral direction in FIG. 3A corresponds to a depth direction of the channel region. When a strain SiGe film having a thickness equal to or thinner than the critical thickness is epitaxially grown on a Si substrate, an energy level at the lower end of a conduction band of the Si substrate is nearly equal to that at the lower end of a conduction band of the SiGe film. In the first embodiment, however, compressive strain of the first film 2 made of SiGe is relaxed, and tensile strain is generated in the second film 3 and in the surface layer of the support substrate 1 made of Si. Therefore, an energy level Ec at the lower end of the conduction band in the surface layer of the support substrate 1 and in the second film 3 becomes lower than an energy level Ec at the lower end of the conduction band of the first film 2.

As a positive voltage is applied to the gate electrode 10G, electrons are accumulated at an interface CHe between the support substrate 1 and first film 2, and a channel is generated. The second film 3 is as thin as the operation of MOSFET is not influenced. The channel is therefore generated at a deep position spaced from the interface between the gate insulating film 101 and semiconductor layer (second film 3). Since electrons moving in the channel are not influenced by roughness of the interface between the gate insulating film 10G and semiconductor layer and by interface state, a mobility of electrons can be expected to be improved. It is known that if Si has tensile strain, energy degeneracy of electrons in Si is released so that an electron mobility can be improved. With these advantages, it is possible to improve the performance of the n-channel MOSFET 10.

In the n-channel MOSFET 10, the second film 3 is not essential for the transistor operation. If the gate insulating film 101 is formed so as to be direct contact with the first film 2 made of SiGe, an interface state density becomes high. The interface state density can be lowered by inserting the second film 3 made of Si between the first film 2 made of SiGe and the gate insulating film 101 made of silicon oxide.

Figure 3B:
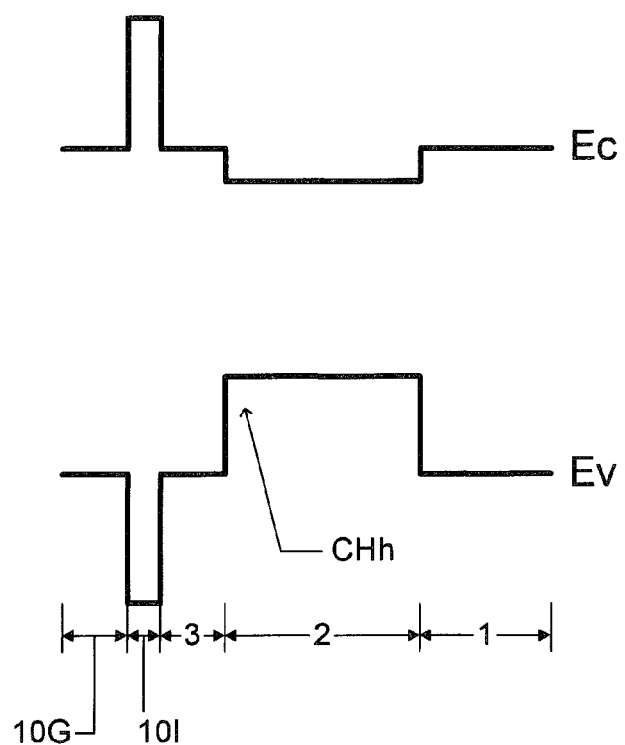

FIG. 3B is an energy band diagram of the channel region of the p-channel MOSFET 11. A lateral direction in FIG. 3B corresponds to a depth direction of the channel region. The first film 2 made of SiGe and having compressive strain immediately after film formation has further compressive strain because of the second stressor. As a negative voltage is applied to the gate electrode 11G, holes are accumulated at an interface CHh between the first film 2 and second film 3 and a channel is generated.

As in the case of the n-channel MOSFET 10, a hole mobility can be expected to be improved because holes are not influenced by roughness of the interface between the gate insulating film 11I and semiconductor layer and by interface state. Further, since the first film 2 made of SiGe has further compressive strain by the second stressor 15, a hole mobility can be expected to be improved. With these advantages, it is possible to improve the performance of the p-channel MOSFET 11.

By adopting the structure of the first embodiment, a CMOS circuit and a Si-based high electron mobility transistor (HEMT) can operate at high speed and with low consumption power.

In order to generate strain efficiently in the channel region, it is preferable that the thickness T2 of the first stressor 14 is equal to or more than five times the distance T3 from the upper surface of the support substrate 1 to the bottom of the first stressor 14.

In the first embodiment, the first stressor 14 on the upper surface of the gate electrode 10G has also tensile stress. If the gate electrode 10G is thin, this tensile stress affects the channel region and generates compressive strain in the channel region. This function relaxes tensile strain generated by the first stressor 14 covering both side walls of the gate electrode 10G. In order to generate tensile strain efficiently in the channel region, it is preferable that the height T1 from the bottom of the first stressor 14 disposed on both sides of the gate electrode 10G to the bottom of the first stressor 14 disposed on the upper surface of the gate electrode 10G is equal to or larger than a distance of L1+2×L2 between the first stressor 14 disposed on one side of the gate electrode 10G and the first stressor 14 disposed on the other side.

In order to obtain sufficient effects by generating strain in the channel have strain, it is preferable that a stress applied to the channel region is equal to or larger than 2 GPa. For example, a stress generated at an interface between a Si layer and a $Si_{0.8}Ge_{0.2}$ layer is about 2 GPa. For example, when a Si layer is epitaxially grown on a strain relaxed $Si_{0.8}Ge_{0.2}$ layer, a stress generated in the whole Si layer is about 2 GPa.

These preferable size values of the n-channel MOSFET 10 can be applied to the p-channel MOSFET 11.

Donors may be doped in the first film 2 in the active region 5 where the n-channel MOSFET 10 is disposed. Electrons generated from donors in the first film 2 are accumulated at the interface between the support substrate 1 and first film 2 to generate a channel. In this manner, a normally-on type MOSFET can be obtained. Donors may be doped in the second film 13.

Next, with reference to FIGS. 4A to 4E, description will be made on a manufacture method of the semiconductor device of the first embodiment.

A buffer layer 1A of Si is epitaxially grown on a substrate 1 of Si cut from an ingot pulled up by the Czochralski method. The substrate including the buffer layer 1A is hereinafter called a support substrate 1. A first film 2 made of SiGe and a second film 3 made of Si are epitaxially grown in this order on and over the support substrate 1. The buffer layer 1A, first film 2 and second film 3 can be formed, for example, by chemical vapor deposition (CVD).

A thickness of the first film 2 is equal to or thinner than the critical thickness, and compressive strain is generated in the in-plane direction in the first film 2. This strain is not relaxed up to the upper surface of the first film 2, and a lattice constant at the upper surface of the first film 2 is equal to that of Si single crystal. Since the strain is not relaxed, crystallinity of the first film 2 can be maintained high quality. Crystallinity of the second film 3 formed on the first film 2 is also maintained high quality.

An isolation insulating film 4 is formed by a well-known shallow trench isolation (STI) method. The isolation insulating film 4 reaches a region deeper than the bottom of the first film 2. The isolation insulating film 4 defines active regions 5 and 6. A p-type well 7 is formed in a surface layer of the active region 5, and an n-type well 8 is formed in a surface layer of the active region 6. FIGS. 4B to 4E are cross sectional views of the active regions 5 and 6.

Figure 4B:
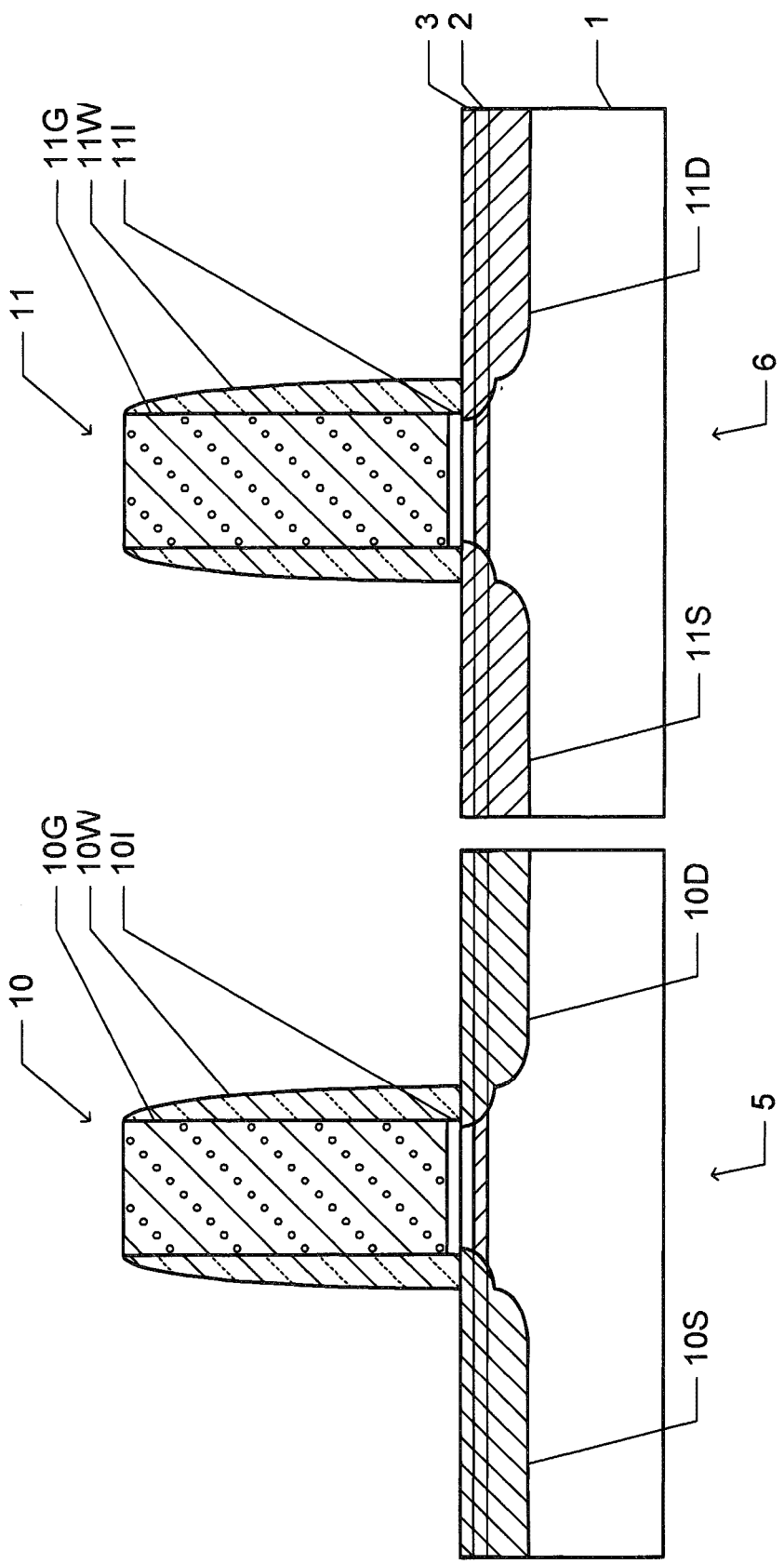

As shown in FIG. 4B, an n-channel MOSFET 10 is formed in the active region 5, and a p-channel MOSFET 11 is formed in the active region 6. In the following, description will be made on a method of forming MOSFET's 10 and 11.

A surface of the second film 3 made of Si is thermally oxidized at a temperature of 800° C. or lower to form a silicon oxide film constituting the gate insulating films 10I and 11I are formed. On this silicon oxide film, a polysilicon film is deposited, the polysilicon film constituting the gate electrodes 10G and 11G are formed. The polysilicon film and silicon oxide film are patterned to form the gate insulating films 10I and 11I and gate electrodes 10G and 11G.

By using the gate electrode 10G as a mask, arsenic (As) is implanted into the active region 5 to form extension regions of a source region 10S and a drain region 10D. By using the gate electrode 11G as a mask, boron (B) is implanted into the active region 6 to form extension regions of a source region 11S and a drain region 11D.

A silicon oxide film is deposited and anisotropically etched to form side wall spacers 10W and 11W on side walls of the gate electrodes 10G and 11G. By using the gate electrode 10G and sidewall spacers 10W as a mask, As is implanted into the active region 5 to form deep high concentration regions of the source region 10S and drain region 10D. In this case, As is implanted also into the gate electrode 10G. By using the gate electrode 11G and side wall spacers 11W as a mask, B is implanted into the active region 6 to form deep high concentration regions of the source region 11S and drain region 11D. In this case, B is implanted also into the gate electrode 11G. After ion implantation of these dopants, annealing is performed for activation.

Figure 4C:
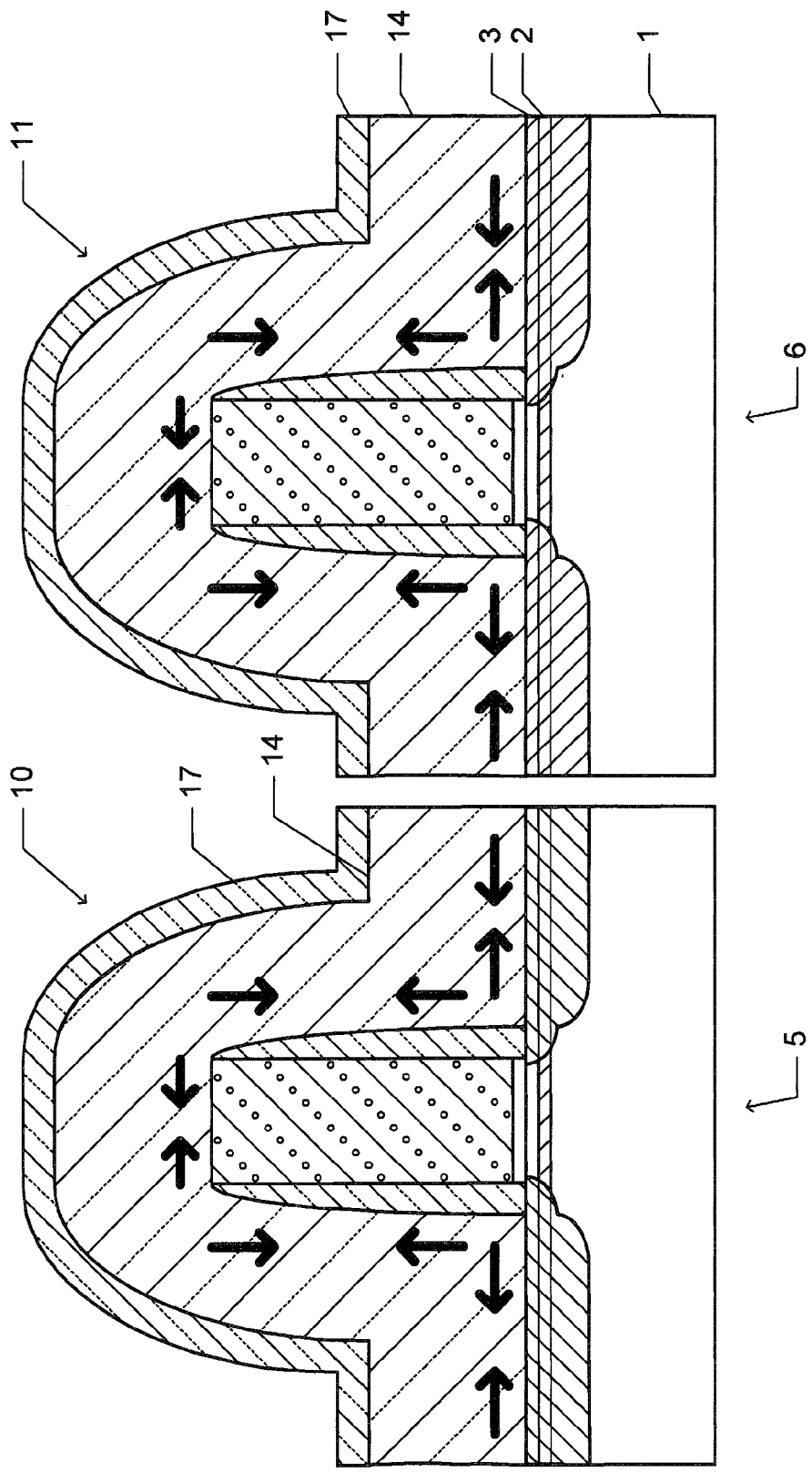

As shown in FIG. 4C, a first stressor 14 of SiN is deposited on the whole surface. For example, the first stressor 14 is deposited by low pressure thermal CVD under the conditions of a pressure of 100 Pa and a growth temperature of 800° C., by using $SiH_4$, $NH_3$ and $N_2$ as source gases. The SiN film deposited by low pressure thermal CVD under the above-described conditions internally contains tensile stress. On the first stressor 14, an etching stopper film 17 of silicon oxide is formed by CVD.

Figure 4D:
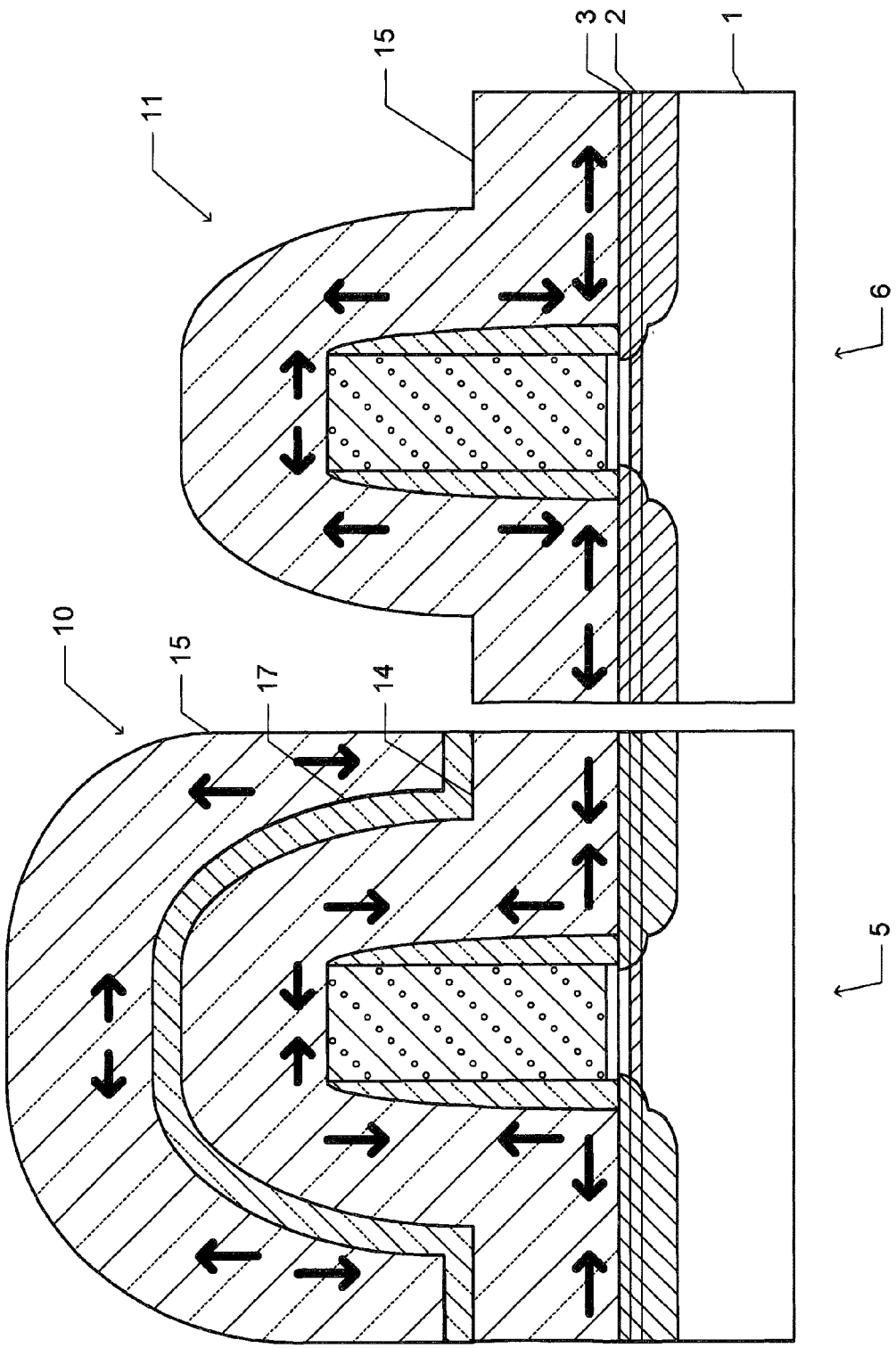

Processes up to the state shown in FIG. 4D will be described. The etching stopper film 17 in the region where the n-channel MOSFET 10 is disposed is covered with a resist pattern, and the first stressor 14 and etching stopper film 17 in the active region 6 where the p-channel MOSFET 11 is disposed are removed. After the resist pattern is removed, a second stressor 15 of SiN is formed on the whole surface. For example, the second stressor 15 is deposited by plasma enhanced CVD under the conditions of a pressure of 500 Pa and a growth temperature of 400° C., by using tetramethylsilane (4MS), $NH_3$, and $N_2$ as source gases. The SiN film deposited by plasma enhanced CVD under the above-described conditions internally contains compressive stress. The second stressor 15 covers the gate electrode 11G of the p-channel MOSFET 11 and second film 3 on both sides of the gate electrode 11G.

Figure 4E:
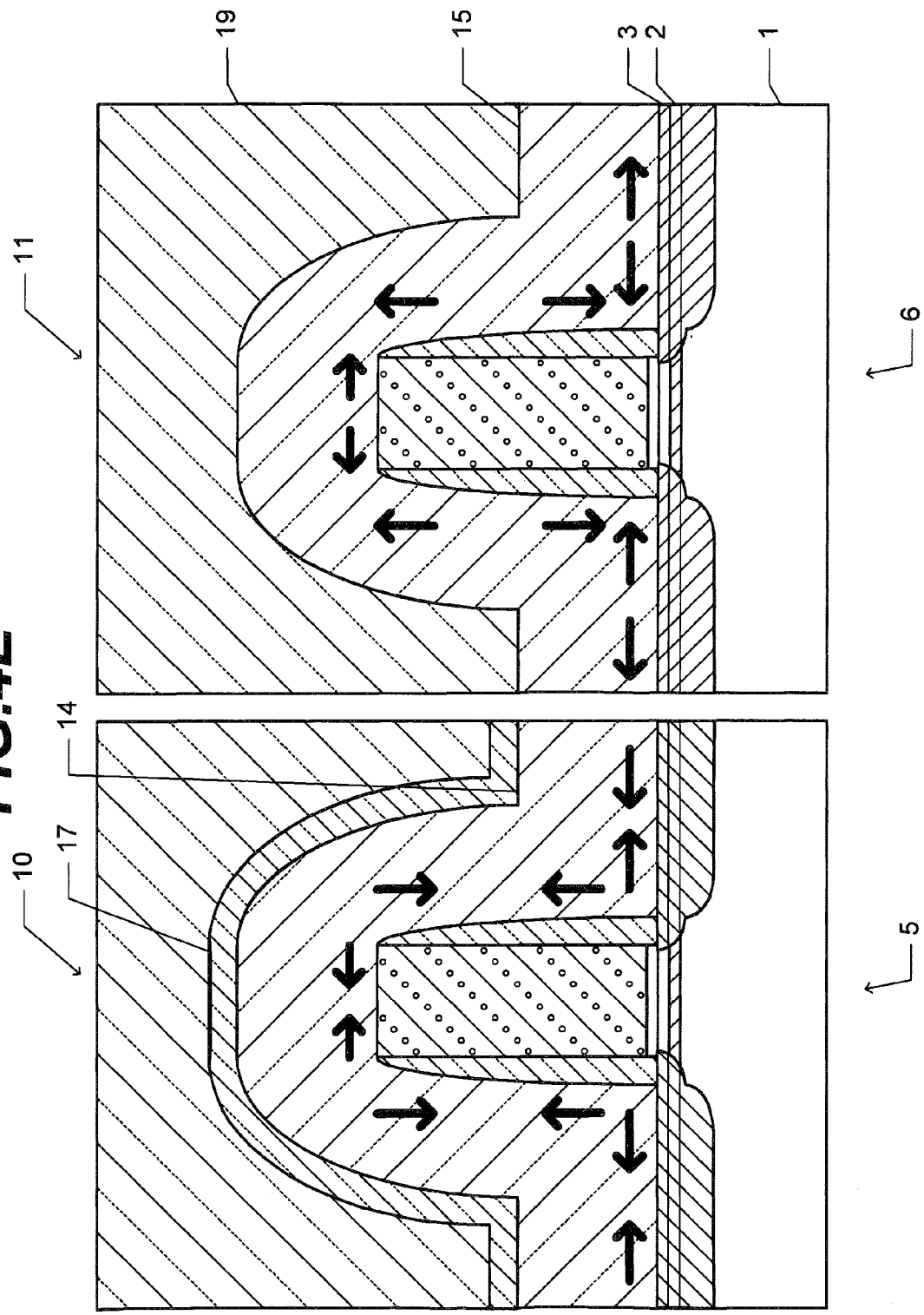
FIG. 4E is a cross sectional view of the semiconductor device according to the first embodiment.

Processes up to the state shown in FIG. 4E will be described. The second stressor 15 in the region where the p-channel MOSFET 11 is disposed is covered with a resist pattern, and the second stressor 15 on the etching stopper film 17 is removed. In this case, etching the second stressor 15 is stopped by the etching stopper film 17.

After the resist pattern is removed, an interlayer insulating film 19 of silicon oxide or the like is deposited on the whole surface.

According to the above-described method of the first embodiment, compressive strain and tensile strain can be generated in channel regions of MOSFET's by adopting a simple structure that the first and second stressors 14 and 15 are added to conventional MOSFET's having an Si/SiGe hetero junction structure. This manufacture method can be readily incorporated into production lines without changing greatly conventional manufacture processes.

Next, with reference to FIGS. 5A to 5E, description will be made on a semiconductor device manufacture method and a semiconductor device according to the second embodiment.

Processes up to the state shown in FIG. 4B described in the first embodiment are common to those of the second embodiment.

Figure 5A:
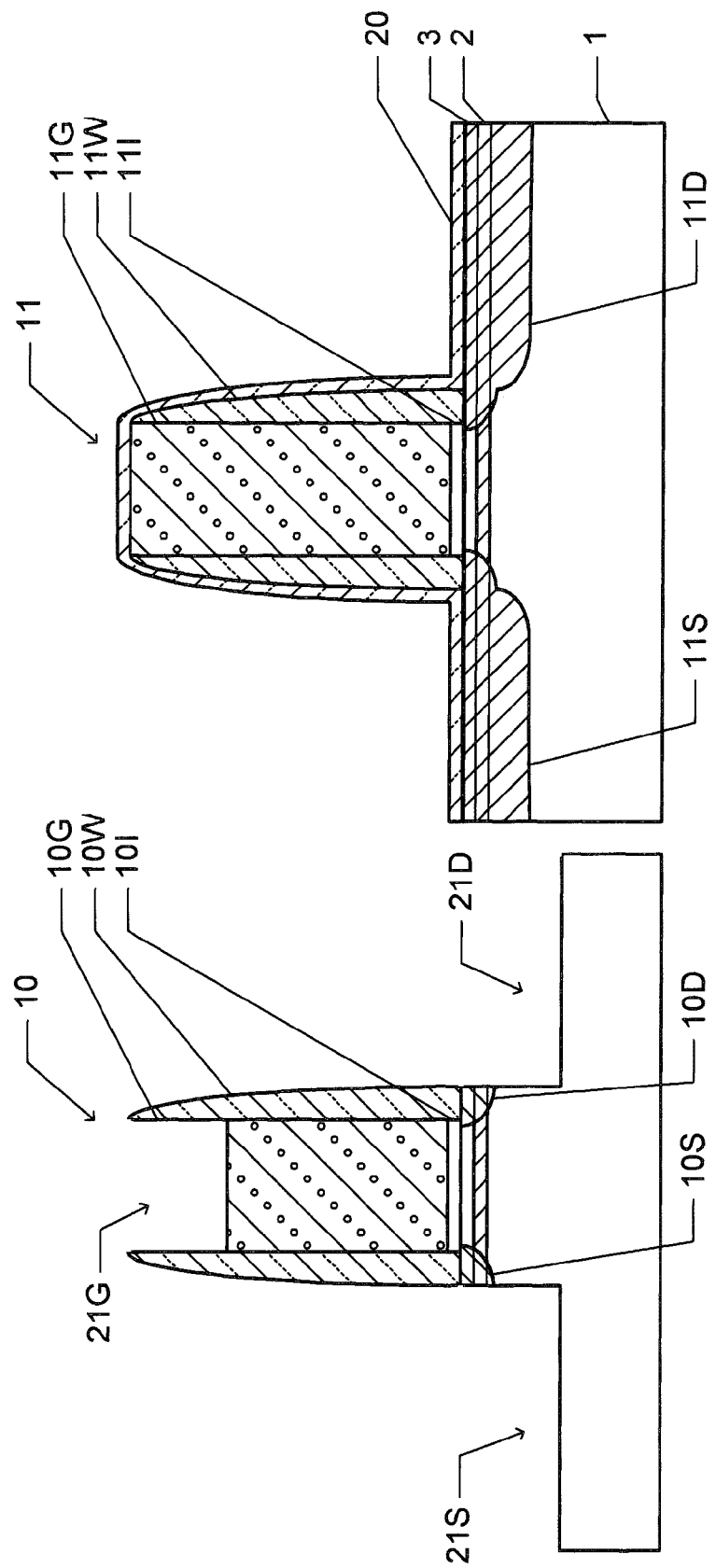

Processes up to the state shown in FIG. 5A will be described. A mask film 20 made of silicon oxide is formed on the whole surface. The mask film 20 in the region where a p-channel MOSFET 11 is disposed is covered with a resist pattern, and the mask film 20 is etched. An n-channel MOSFET 10 is therefore exposed.

Etching is performed under the condition of a sufficiently large etching rate ratio of silicon to silicon oxide. This etching forms therefore recesses 21S and 21D outer side of side wall spacers 10W. At the same time, a gate electrode 21G is partially etched to form a recess 21G surrounded by the side wall spacers 10W. After the recesses 21S, 21D and 21G are formed, the resist pattern used as the etching mask for etching the mask film 20 is removed.

Figure 5B:
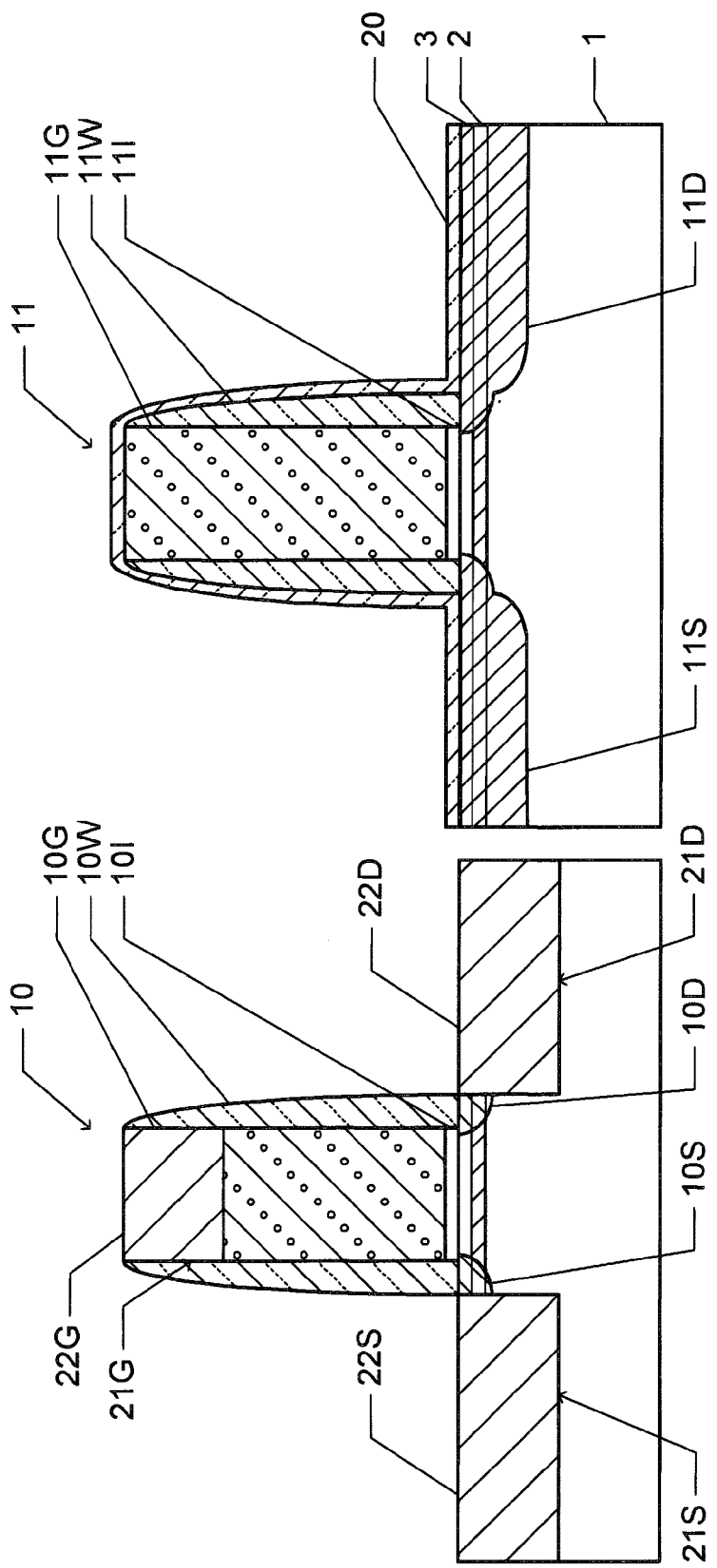

As shown in FIG. 5B, third stressor 22S, 22D and 22G made of SiC are epitaxially grown on the exposed Si surfaces in the recesses 21S, 21D and 21G, respectively. This growth is performed by CVD under the condition that SiC is not grown on the silicon oxide surface but selectively grows on the Si surface. After selective growth, the mask film 20 remaining on the p-channel MOSFET 11 is removed.

Figure 5C:
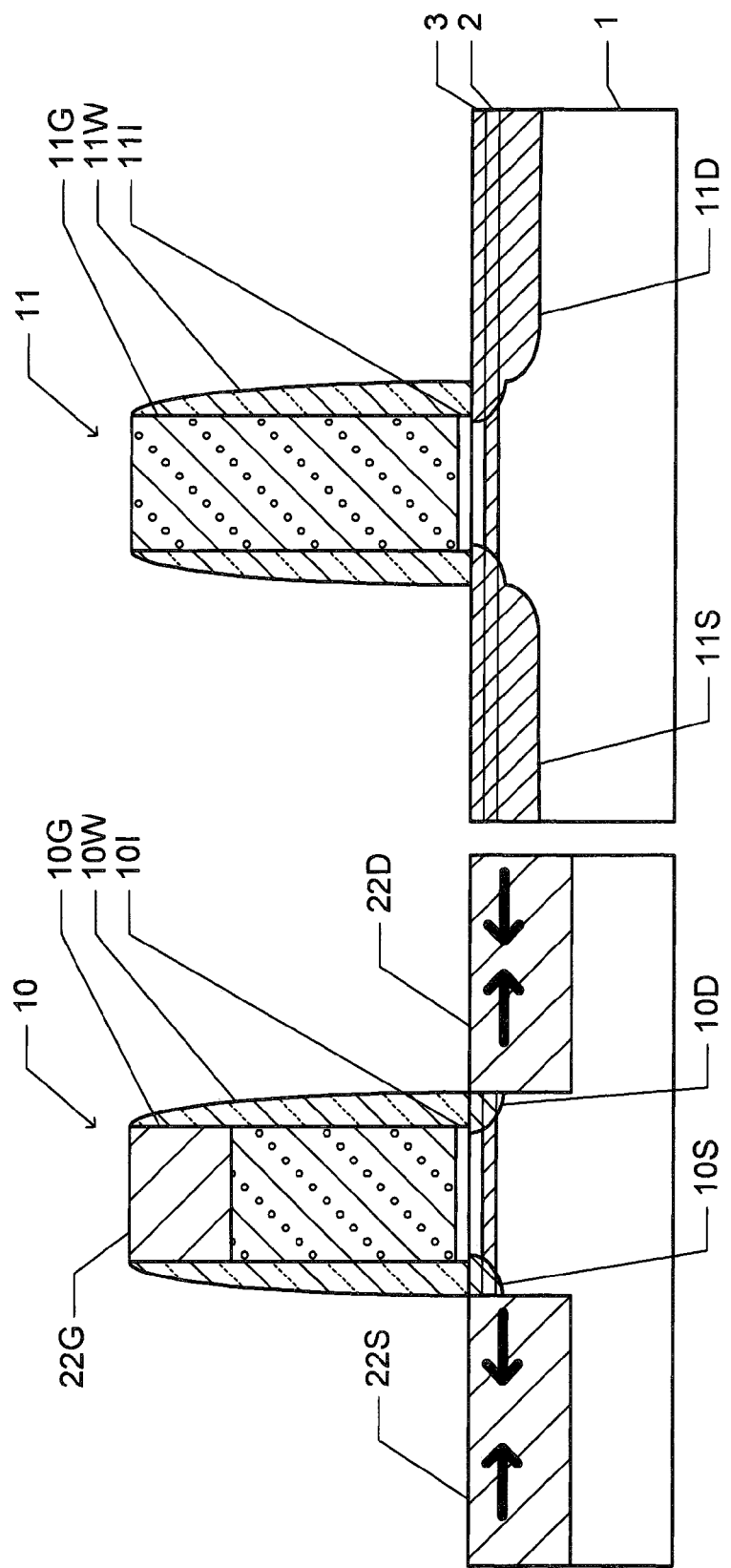

FIG. 5C shows the state after the mask film 20 is removed. Since a lattice constant of SiC is smaller than that of Si, the third stressors 22S, 22D and 22G have tensile strain. Namely, the third stressors 22S, 22D and 22G tend to shrink in the in-plane direction.

As shown in FIG. 5D, recesses are formed outer side of the side wall spacers 11W of the p-channel MOSFET 11 and on the surface of the gate electrode 11. Fourth stressors 23S, 23D and 23G made of SiGe are epitaxially grown on the Si surfaces in these recesses. The fourth stressors 23S, 23D and 23G can be formed by a method same as the method used for the third stressors 22S, 22D and 22G.

Since a lattice constant of SiGe is larger than that of Si, the fourth stressors 23S, 23D and 23G have compressive strain. Namely, the fourth stressors 23S, 23D and 23G tend to extend in the in-plane direction.

Figure 5E:
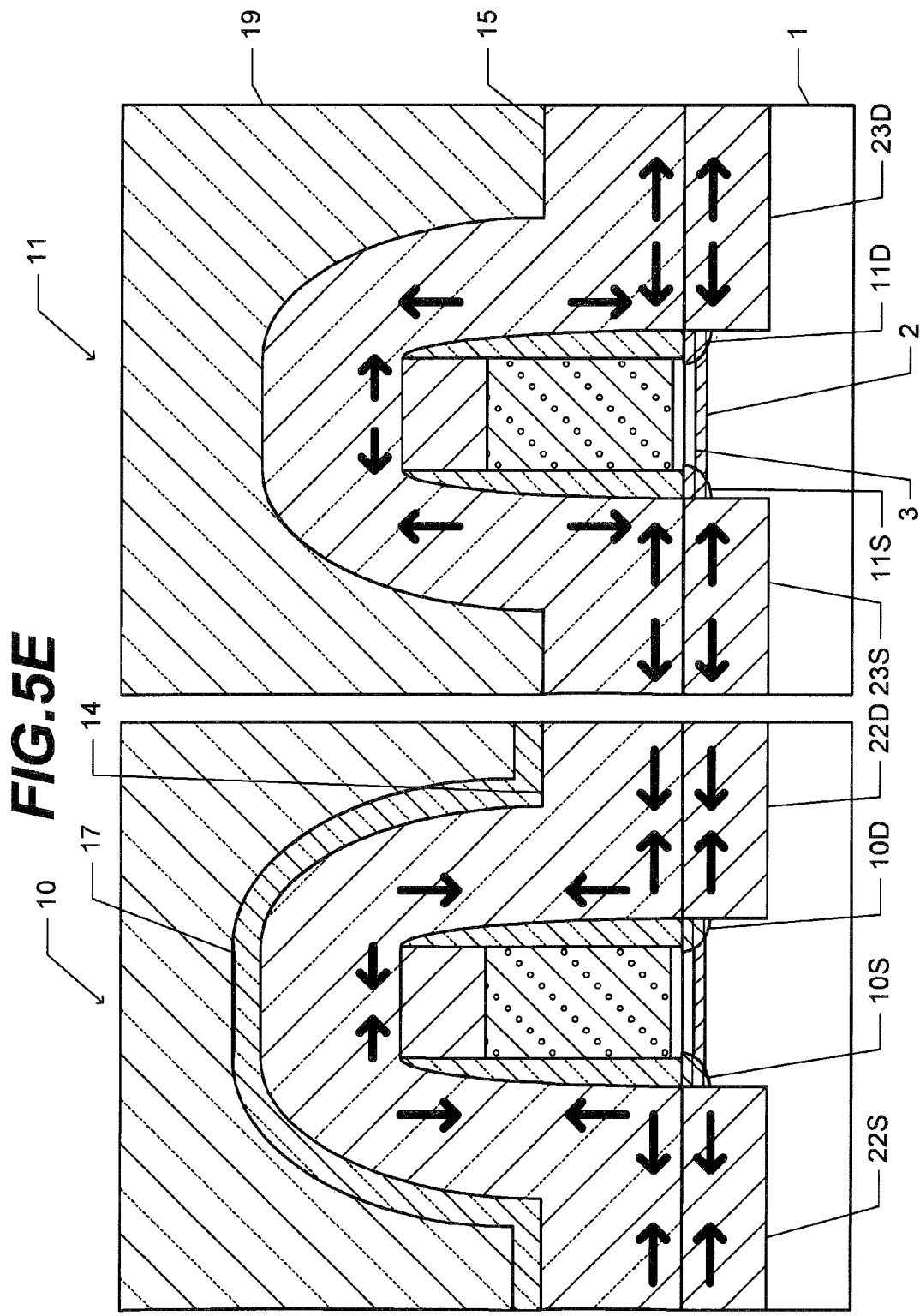
FIG. 5E is a cross sectional view of the semiconductor device according to the second embodiment.

As shown in FIG. 5E, a first stressor 14 covering the n-channel MOSFET 10 is formed, and a second stressor 15 covering the p-channel MOSFET 11 is formed. The first stressor 14 and second stressor 15 are formed by a method same as the method used for the first stressor 14 and second stressor 15 of the semiconductor device of the first embodiment described with reference to FIGS. 4C to 4E. An etching stopper film 17 made of silicon oxide is disposed on the first stressor 14. An interlayer insulating film 19 is formed on the etching stopper film 17 and second stressor 15.

In the second embodiment, in the n-channel MOSFET 10, the first stressor 14 and the third stressors 22S and 22D cooperate to generate tensile strain in the channel region. In the p-channel MOSFET 11, the second stressor 15 and the fourth stressors 23S and 23D cooperate to generate compressive strain in the channel region. Therefore, as compared to the first embodiment, larger strain can be formed in the channel region.

Instead of SiC, material having a lattice constant smaller than that of Si and being capable of epitaxially growing on the Si surface may be used as material of the third stressors 22S, 22D and 22G. Instead of SiGe, material having a lattice constant larger than that of Si and being capable of epitaxially growing on the Si surface may be used as material of the fourth stressors 23S, 23D and 23G.

Figure 6:
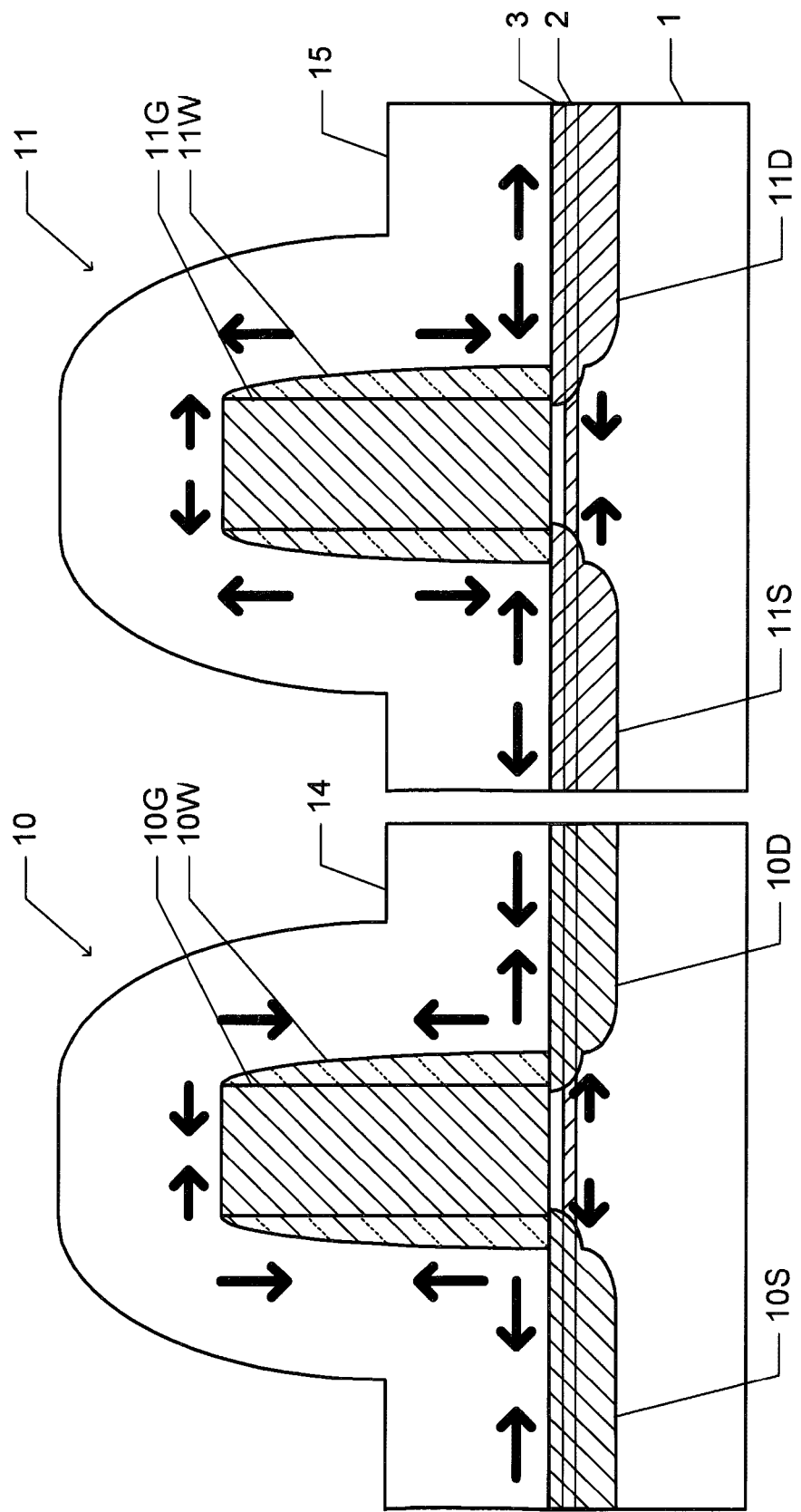
FIG. 6 is a cross sectional view of a semiconductor device according to a third embodiment.

FIG. 6 is a cross sectional view of a semiconductor device according to the third embodiment. Although the semiconductor device of the first embodiment shown in FIG. 2 adopts an insulated gate structure, the third embodiment adopts a Schottky gate structure. Namely, the gate insulating films 10I and 11I shown in FIG. 2 are not disposed, but gate electrodes 10G and 11G are made in Schottky contact with a second film 3. In the third embodiment, the gate electrodes 10G and 11G are made of conductive material capable of being in Schottky contact with Si, such as platinum (Pt), titanium (Ti) and aluminum (Al). Other structures are the same as those of the semiconductor device of the first embodiment shown in FIG. 2.

The characteristics of FET having the Schottky gate structure can be improved by making the channel region have strain, as in the case of the first embodiment.

In the first to third embodiments, although SiN is used as the material of the first stressor 14 and second stressor 15, other materials internally containing compressive or tensile strain may also be used. For example, a titanium nitride (TiN) film and a carbon (C) film deposited by sputtering internally contain compressive strain.

In the first to third embodiments, although MOSFET is formed on the support substrate 1 made of Si, an SOI substrate may be used as the support substrate.

The present invention has been described in connection with the preferred embodiments. The invention is not limited only to the above embodiments. It will be apparent to those skilled in the art that other various modifications, improvements, combinations, and the like can be made.

What are claimed are:

1. A semiconductor device comprising:
   a support substrate whose surface layer is made of Si;
   a first film consisting essentially of SiGe and formed over the support substrate;
   a first field effect transistor including a gate electrode formed over a partial area of the first film and source and drain regions formed in the surface layer of the support substrate on sides of the gate electrode, the first field effect transistor being an n-channel transistor; and
   a first stressor internally containing tensile strain and formed over the first film on both sides of the gate electrode of the first field effect transistor.

2. The semiconductor device according to claim 1, wherein the first stressor covers side walls and an upper surface of the gate electrode of the first field effect transistor, and a height from the bottom of the first stressor disposed on both sides of the gate electrode to a bottom of the first stressor disposed on the upper surface of the gate electrode is equal to or larger than a distance between the first stressor disposed on one side of the gate electrode and the first stressor disposed on the other side of the gate electrode.

3. The semiconductor device according to claim 1, further comprising:
   a second field effect transistor including a gate electrode formed over another partial area of the first film and source and drain regions formed in the surface layer of the support substrate on sides of the gate electrode; and
   a second stressor formed over a surface of the support substrate on both sides of the gate electrode of the second field effect transistor,
   wherein the second field effect transistor is a p-channel transistor, and the second stressor internally contains compressive stress.

4. The semiconductor device according to claim 1, wherein donors are doped in the first film.

5. The semiconductor device according to claim 1, wherein the first field effect transistor further comprises a gate insulating film made of insulating material between the gate electrode of the first field effect transistor and the first film.

6. The semiconductor device according to claim 1, wherein the gate electrode is in Schottky contact with a semiconductor surface under the gate electrode.

7. The semiconductor device according to claim 1, wherein recesses are formed in the support substrate on sides of the gate electrode, and material having a lattice constant smaller than a lattice constant of Si single crystal is epitaxially grown in the recesses.

8. The semiconductor device according to claim 7, wherein the material having the lattice constant smaller than a lattice constant of Si single crystal is SiC.

9. The semiconductor device according to claim 1, further comprising a second film made of Si formed over the first film, wherein the gate electrode is formed over the second film.

10. The semiconductor device according to claim 9, wherein donors are doped in the second film.

11. A semiconductor device comprising:
a support substrate whose surface layer is made of Si;
a first film made of SiGe and formed over the support substrate;
a first field effect transistor including a gate electrode formed over a partial area of the first film and source and drain regions formed in the surface layer of the support substrate on both sides of the gate electrode; and
a first stressor internally containing compressive strain or tensile strain and formed over the first film on both sides of the gate electrode of the first field effect transistor,
wherein a thickness of the first stressor is equal to or larger than five times a distance from an upper surface of the support substrate to a bottom of the first stressor.

12. A semiconductor device comprising:
a support substrate whose surface layer is made of Si;
a first film made of SiGe and formed over the support substrate;
a first field effect transistor including a gate electrode formed over a partial area of the first film and source and drain regions formed in the surface layer of the support substrate on both sides of the gate electrode;
a first stressor internally containing compressive strain or tensile strain and formed over the first film on both sides of the gate electrode of the first field effect transistor; and
a material between the gate electrode and the first stressor, the material having a lattice constant larger than a lattice constant of Si single crystal.

13. The semiconductor device according to claim 12, wherein the material having the lattice constant larger than a lattice constant of Si single crystal is SiGe.

14. A semiconductor device comprising:
a support substrate whose surface layer is made of Si;
a first film made of SiGe and formed over the support substrate;
a first field effect transistor including a gate electrode formed over a partial area of the first film and source and drain regions formed in the surface layer of the support substrate on both sides of the gate electrode;
a first stressor internally containing compressive strain or tensile strain and formed over the first film on both sides of the gate electrode of the first field effect transistor, and
a material between the gate electrode and the first stressor, the material having a lattice constant smaller than a lattice constant of Si single crystal.

15. The semiconductor device according to claim 14, wherein the material having the lattice constant smaller than a lattice constant of Si single crystal is SiC.

16. A method of manufacturing a semiconductor device comprising:
(a) forming a first film consisting essentially of SiGe having compressive strain over a support substrate whose surface layer is made of Si;
(b) forming a first gate electrode over a partial area of the first film;
(c) doping first impurities of n-type into the first film and the surface layer of the support substrate on sides of the first gate electrode; and
(d) covering the first gate electrode and a substrate surface adjacent to the first gate electrode with a first stressor internally containing tensile stress.

17. The method according to claim 16, further comprising forming a second film made of Si between the first film and the first gate electrode.

18. The method according to claim 16, further comprising:
forming a second gate electrode over a partial area of the first film;
doping second impurities of p-type into the first film and the surface layer of the support substrate on sides of the second gate electrode; and
covering the second gate electrode and a substrate surface adjacent to the second gate electrode with a second stressor internally containing compressive stress.

* * * * *